United States Patent
Sprafke et al.

(10) Patent No.: US 12,087,704 B2
(45) Date of Patent: Sep. 10, 2024

(54) COMPOSITE STRUCTURE FOR IMAGE PLANE NORMALIZATION OF A MICROELECTRONIC HYBRID DEVICE

(71) Applicant: Raytheon Company, Waltham, MA (US)

(72) Inventors: Thomas Sprafke, Huntsville, UT (US); Stephen Marinsek, Albuquerque, NM (US); Christopher Cobb, Goleta, CA (US)

(73) Assignee: Raytheon Company, Tewksbury, MA (US)

( * ) Notice: Subject to any disclaimer, the term of this patent is extended or adjusted under 35 U.S.C. 154(b) by 455 days.

(21) Appl. No.: 17/546,184

(22) Filed: Dec. 9, 2021

(65) Prior Publication Data

US 2022/0246543 A1 Aug. 4, 2022

Related U.S. Application Data

(60) Provisional application No. 63/143,202, filed on Jan. 29, 2021.

(51) Int. Cl.
| | |
|---|---|
| *H01L 23/00* | (2006.01) |
| *G01J 3/02* | (2006.01) |
| *H01L 23/34* | (2006.01) |
| *H01L 23/36* | (2006.01) |
| *H01L 23/40* | (2006.01) |
| *H01L 27/146* | (2006.01) |

(52) U.S. Cl.
CPC ............ *H01L 23/562* (2013.01); *H01L 23/34* (2013.01); *H01L 23/36* (2013.01); *H01L 27/14634* (2013.01); *H01L 27/1469* (2013.01); *G01J 3/0202* (2013.01); *H01L 23/40* (2013.01)

(58) Field of Classification Search
CPC ....... H01L 23/562; H01L 23/34; H01L 23/36; H01L 27/14634; H01L 27/1469; H01L 23/40; G01J 3/0202
See application file for complete search history.

(56) References Cited

U.S. PATENT DOCUMENTS

| | | | | |
|---|---|---|---|---|
| 2004/0135251 | A1* | 7/2004 | Tellkamp | B23K 3/0623 257/E21.511 |
| 2010/0123072 | A1* | 5/2010 | Sprafke | H01L 27/14601 250/239 |
| 2017/0105311 | A1* | 4/2017 | Pillans | H01L 24/73 |
| 2020/0176397 | A1* | 6/2020 | Liu | H01L 21/6835 |

* cited by examiner

*Primary Examiner* — Joseph C. Nicely
*Assistant Examiner* — Alvin L Lee

(57) ABSTRACT

A composite structure includes a first surface and a second surface sandwiched together with a field array of individual and discrete pillars extending therebetween. The plurality of discrete pillars each have a tailored coefficient of thermal expansion and are designed to expand and contract over varying temperatures. The discrete pillars are specifically arranged within the composite structure to compensate for the shrinkage and expansion of different components of a microelectronic hybrid device, to reduce thermal expansion induced deformations imparted on facets of the microelectronic hybrid device under varying temperatures.

20 Claims, 5 Drawing Sheets

TYPICAL IMAGE PLANE SURFACE MAP (WAVEFRONT)

RESULTANT IMAGE PLANE SURFACE MAP (NORMALIZED WAVEFRONT)

COMPOSITE STRUCTURE FOR IMAGE PLANE NORMALIZATION OF A MICROELECTRONIC HYBRID DEVICE

PRIORITY INFORMATION

This application claims the benefit of U.S. Provisional Application No. 63/143,202, filed Jan. 29, 2021, the entire disclosure of which is hereby incorporated by reference.

TECHNICAL FIELD

The present invention relates generally to microelectronic hybrid devices with integrated circuits and more particularly to image plane normalization of microelectronic hybrid devices.

BACKGROUND

Microelectronic hybrid devices, such as sensor chip assemblies, include electronic devices (for example, semiconductor chips and detectors) interconnected with integrated circuit devices (for example, read out integrated circuits (ROICs)) via interconnect attachment joints (for example, indium bump interconnects). Microelectronic hybrid devices are often configured to operate under extreme temperatures (e.g., cryogenic temperatures) and experience temperature changes and thermal cycling. When different components of a microelectronic hybrid device have different coefficients of thermal expansion (CTE), thermo-mechanical stresses are imparted on the device when it is subjected to these extreme temperature conditions. For example, as components of the microelectronic hybrid device shrink and expand at different rates, bowing of the components may occur and impart stress on the interconnect attachment joints between the electronic device and the integrated circuit. This bowing prevents the formation of strong, reliable, and consistent bonds between the electronic device and the integrated circuit, resulting in a non-flat image surface and impaired optical performance of the microelectronic hybrid device.

Prior attempts to reduce this bowing have included the use of a series of flat shims under the integrated circuit in an attempt to reduce stress, however these prior attempts have failed to completely compensate for the image plane bowing. For example, a conventional microelectronic hybrid device 1 is depicted in FIG. 1 with a series of flat shims 2 provided underneath an ROIC 3. As illustrated in the image plane surface map depicted below the device 1, the shims 2 fail to eliminate the image plane bow 4 that results from the thermo-mechanical stresses imparted on the device 1 when subjected to operational temperature conditions. The resultant bow 4 creates problems in the optical performance of the ROIC 3, especially with faster f-numbers. Due to the inherent stress induced on the device 1, particularly on the electronic device attachment joints that interconnect the ROIC 3 with an electronic device in the microelectronic hybrid device 1, this bow 4 also effects reliability of the device 1 over time. Additionally, the bow 4 also effects the proximity of other optical elements (for example, filters) that may be included in the device.

SUMMARY

In a general embodiment, a composite structure includes a first surface and a second surface sandwiched together with a field array of individual and discrete pillars extending therebetween. The plurality of discrete pillars each have a tailored coefficient of thermal expansion and are designed to expand and contract over varying temperatures. The discrete pillars are specifically arranged within the composite structure to compensate for the shrinkage and expansion of different components of a microelectronic hybrid device, to reduce thermal expansion induced deformations imparted on facets of the microelectronic hybrid device under varying temperatures.

According to an aspect of the invention, a composite structure for image plane normalization of a microelectronic hybrid device includes a first surface and a second surface parallel to and spaced apart from the first surface. The composite structure also includes a plurality of discrete pillars extending between the first and second surface. At least some of the plurality of discrete pillars have a different coefficient of thermal expansion than at least some others of the plurality of discrete pillars.

According to an embodiment of any paragraph(s) of this summary, the plurality of discrete pillars are evenly distributed between the first and second surface relative to each other.

According to another embodiment of any paragraph(s) of this summary, the plurality of discrete pillars are unevenly distributed between the first and second surface relative to each other.

According to another embodiment of any paragraph(s) of this summary, a distribution of the plurality of discrete pillars between the first and second surface is controlled as a function of at least one of computational modeling of the composite structure and physical testing.

According to another embodiment of any paragraph(s) of this summary, the plurality of discrete pillars are distributed between the first and second surface in one of: a linear arrangement, a circular arrangement, a triangular arrangement, or a polygonal arrangement.

According to another embodiment of any paragraph(s) of this summary, the density of distribution of the plurality of discrete pillars is controlled as a function of at least one of computational modeling of the composite structure and physical testing.

According to another embodiment of any paragraph(s) of this summary, each of the plurality of discrete pillars are columnar.

According to another embodiment of any paragraph(s) of this summary, each of the plurality of discrete pillars are rectangular.

According to another embodiment of any paragraph(s) of this summary, at least some of the plurality of discrete pillars have a different shape than at least some others of the plurality of discrete pillars.

According to another embodiment of any paragraph(s) of this summary, each of the plurality of discrete pillars have a width between 0.5 mm to 2.0 mm.

According to another embodiment of any paragraph(s) of this summary, each of the plurality of discrete pillars have a width between 0.75 mm to 1.5 mm.

According to another embodiment of any paragraph(s) of this summary, each of the plurality of discrete pillars have a width of 1 mm.

According to another embodiment of any paragraph(s) of this summary, each of the plurality of discrete pillars have a length between 0.5 mm to 2.0 mm.

According to another embodiment of any paragraph(s) of this summary, each of the plurality of discrete pillars have a length between 0.75 mm to 1.5 mm.

According to another embodiment of any paragraph(s) of this summary, each of the plurality of discrete pillars have a length of 1 mm.

According to another embodiment of any paragraph(s) of this summary, each of the plurality of discrete pillars have a height between 0.5 mm to 3.0 mm.

According to another embodiment of any paragraph(s) of this summary, each of the plurality of discrete pillars have a height between 0.75 mm to 2.5 mm.

According to another embodiment of any paragraph(s) of this summary, each of the plurality of discrete pillars have a height between 1.0 mm to 2.0 mm.

According to another embodiment of any paragraph(s) of this summary, each of the plurality of discrete pillars have a height of 1.5 mm.

According to another embodiment of any paragraph(s) of this summary, each of the plurality of discrete pillars have the same dimensions.

According to another embodiment of any paragraph(s) of this summary, at least some of the plurality of discrete pillars have different dimensions than at least some others of the plurality of discrete pillars.

According to another embodiment of any paragraph(s) of this summary, the plurality of discrete pillars include a controlled expansion alloy.

According to another embodiment of any paragraph(s) of this summary, the plurality of discrete pillars include an iron alloy.

According to another embodiment of any paragraph(s) of this summary, the plurality of discrete pillars include a nickel alloy.

According to another embodiment of any paragraph(s) of this summary, the plurality of discrete pillars include a copper alloy.

According to another embodiment of any paragraph(s) of this summary, at least some of the plurality of discrete pillars include a different metal alloy than at least some others of the plurality of discrete pillars.

According to another embodiment of any paragraph(s) of this summary, at least one of the first and second surface include alumina ceramic.

According to another embodiment of any paragraph(s) of this summary, at least one of the first and second surface include aluminum nitride.

According to another embodiment of any paragraph(s) of this summary, at least one of the first and second surface include metal.

According to another embodiment of any paragraph(s) of this summary, the first and second surface include the same material.

According to another embodiment of any paragraph(s) of this summary, the first and second surface include different materials.

According to another aspect of the invention, a microelectronic hybrid device includes an electronic device and an integrated circuit device electrically interconnected with the electronic device. The microelectronic hybrid device also includes the composite structure according to any paragraph(s) of this summary. The composite structure is disposed beneath the integrated circuit device for image plane normalization of the microelectronic hybrid device.

According to an embodiment of any paragraph(s) of this summary, the electronic device is a detector.

According to another embodiment of any paragraph(s) of this summary, the integrated circuit device is part of a readout integrated circuit (ROIC).

According to another aspect of the invention, a method of manufacturing the composite structure according to any paragraph(s) of this summary includes providing the first surface and binding a first end of the plurality of discrete pillars to the first surface. The method also includes providing the second surface and binding a second end of the plurality of discrete pillars opposite the first end to the second surface.

According to an embodiment of any paragraph(s) of this summary, the binding includes soldering.

According to another embodiment of any paragraph(s) of this summary, the binding includes welding.

According to another embodiment of any paragraph(s) of this summary, the binding includes brazing.

According to another embodiment of any paragraph(s) of this summary, the binding includes adhering with an adhesive.

The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings show various aspects of the invention.

DETAILED DESCRIPTION

According to a general embodiment, a composite structure is configured to compensate for the image plane bowing experienced in conventional microelectronic hybrid devices under operating temperatures to achieve image plane normalization. The composite structure includes a first surface and a second surface sandwiched together with a field array of individual and discrete pillars extending therebetween. The plurality of discrete pillars each have a tailored coefficient of thermal expansion and are designed to expand and contract over varying temperatures. The discrete pillars are specifically arranged within the composite structure to compensate for the shrinkage and expansion of the different components of the microelectronic hybrid device and reduce the thermo-mechanical stresses imparted on the microelectronic hybrid device under operating temperatures. Specifically, when the composite structure is disposed beneath the microelectronic hybrid device, the composite structure, particularly the plurality of discrete pillars, is configured to compensate for and neutralize the bowing of the resultant image plane that may have otherwise resulted.

Figure 1:
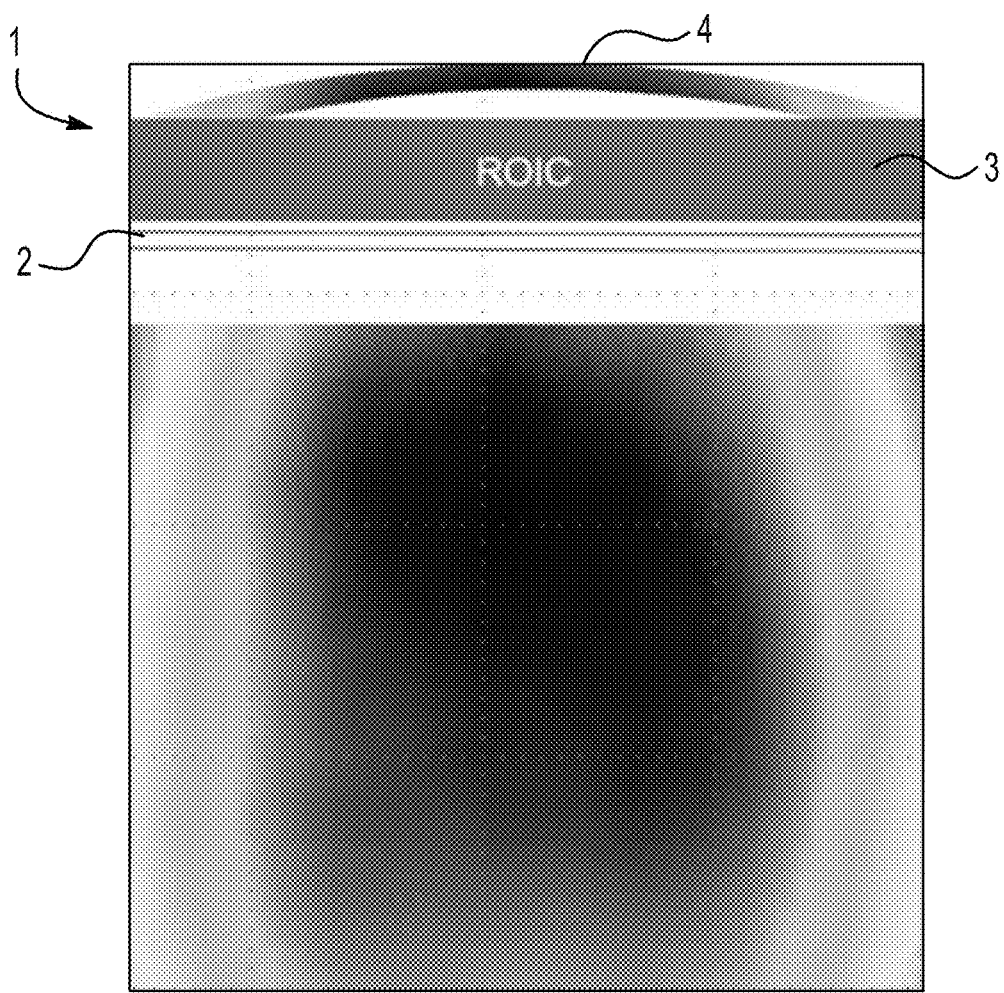
FIG. 1 is a schematic diagram and surface map of a prior art microelectronic hybrid device.
Figure 2:
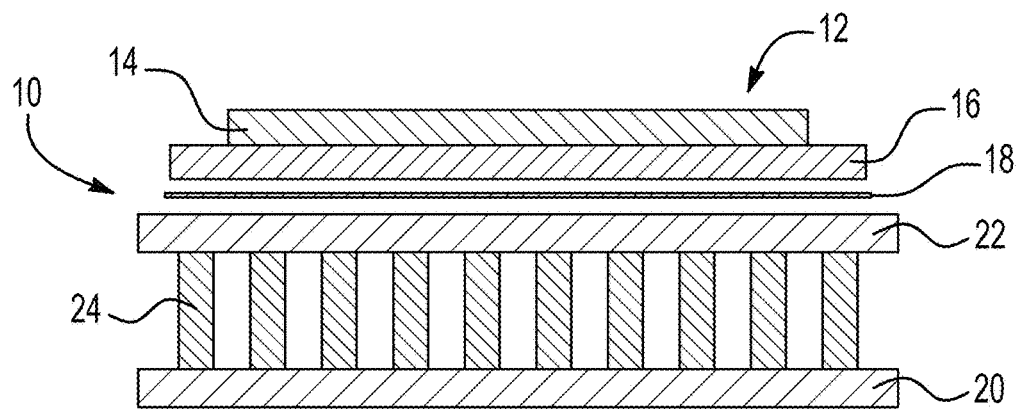
FIG. 2 is a schematic diagram of a microelectronic hybrid device and composite structure according to an embodiment of the present invention.

Referring to FIG. 2, an exemplary composite structure 10 of this type is depicted beneath a microelectronic hybrid device 12. It should be understood that the relative size of the features depicted in the figures is not necessarily to scale. For example, some features are exaggerated for purposes of illustration. The microelectronic hybrid device 12 includes at least an electronic device 14 and an integrated circuit device 16 electrically interconnected with the electronic device 14. The electronic device 14 may be, for example, a semiconductor chip or detector. The integrated circuit device 16 may be, for example, part of a readout integrated circuit (ROIC). The electronic device 14 may be electrically interconnected with the integrated circuit device 16 via interconnect attachment joints. The interconnect attachment joints may include, for example, indium bump interconnects, however the same principles apply to embodiments in which the interconnect attachment joints include other materials. One or more shim 18 may additionally be provided between the composite structure 10 and the integrated circuit device 16 of the microelectronic hybrid device 12 to help account for any in-plane stresses imparted on the microelectronic hybrid device 12. The one or more shim 18 may be secured together with the composite structure 10 and the integrated circuit device 16 with, for example, an adhesive bond.

The composite structure 10 includes a first surface 20 and a second surface 22, parallel to and spaced apart from the first surface 20. A plurality of discrete pillars are arranged to extend between the first surface 20 and the second surface 22, such that the first surface 20 and the second surface 22 are sandwiched together with the plurality of discrete pillars 24 extending therebetween. The composite structure 10 is configured to be arranged beneath the integrated circuit device 16 of the microelectronic hybrid device 12, as depicted in FIG. 2.

Figure 3A:
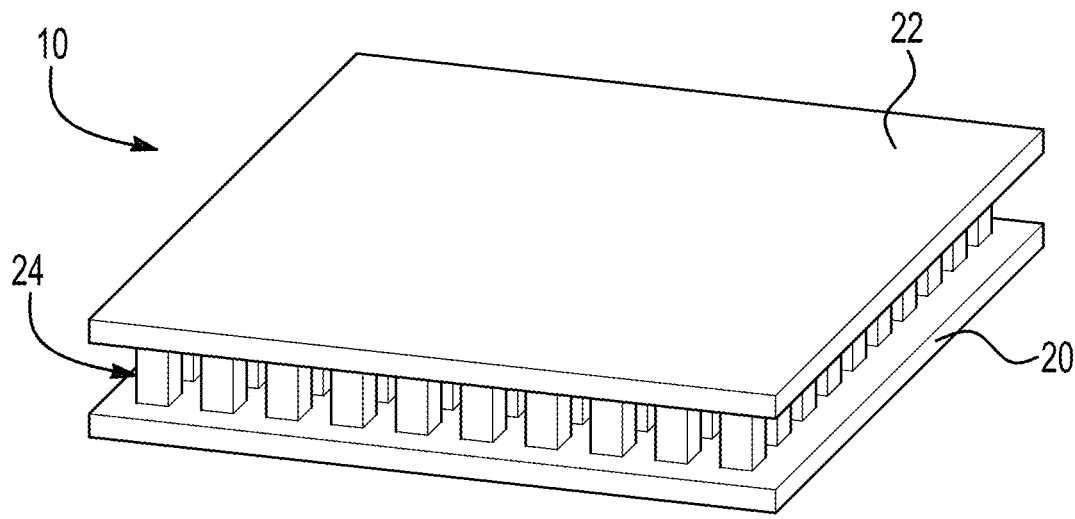
FIG. 3A is a schematic diagram of a composite structure according to an embodiment of the present invention.
Figure 3B:
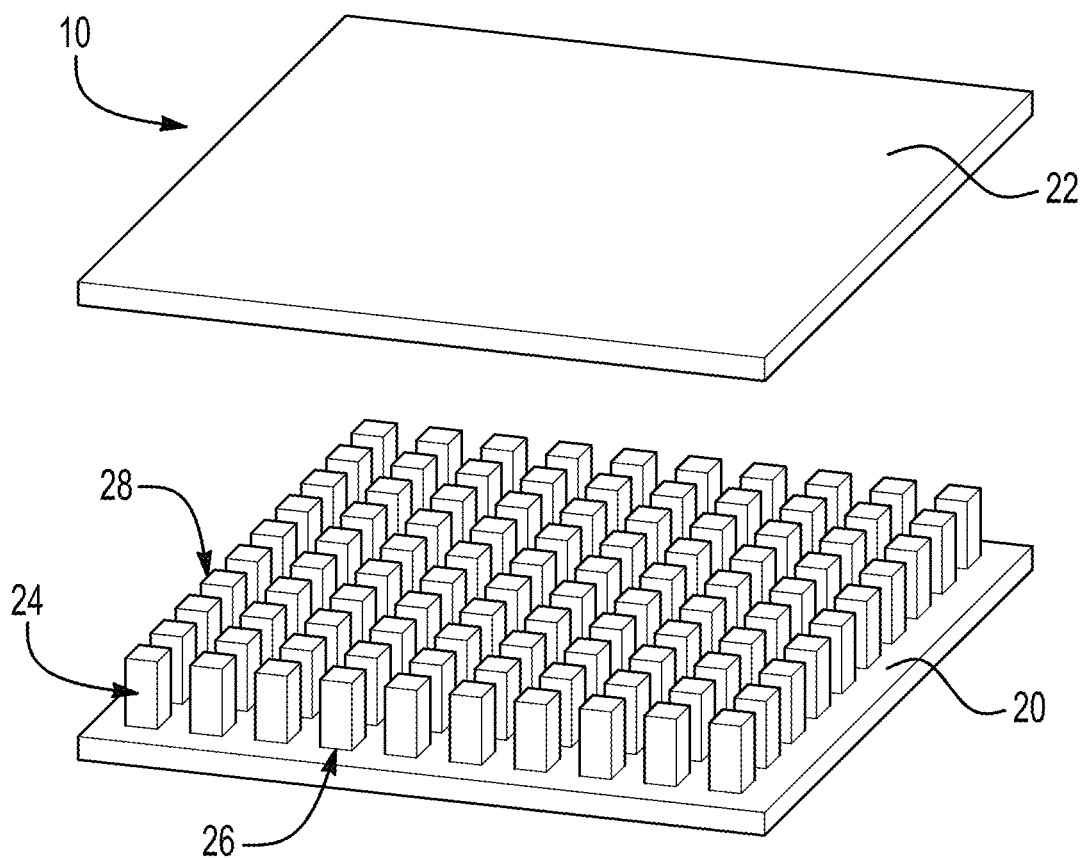
FIG. 3B is a partially exploded view of the composite structure depicted in FIG. 3A.

FIG. 3A depicts the composite structure 10 in isolation from the microelectronic device 12 and FIG. 3B depicts a partially exploded view of the composite structure 10 of FIG. 3A. As depicted, each of the plurality of discrete pillars 24 are secured to the first surface 20 at a first end 26 of each of the plurality of discrete pillars 24. Each of the plurality of discrete pillars 24 are also secured to the second surface 22 at a second end of each of the plurality of discrete pillars 24. The plurality of discrete pillars 24 may be secured, for example, by soldering, welding, brazing and/or adhering with an adhesive the first and second ends 26, 28 to the first and second surfaces 20, 22, respectively.

With additional reference to FIGS. 4A-4F, the plurality of discrete pillars 24 may include any number, shape, size and arrangement suitable for the application in which the composite structure 10 is to be used. The number, shape, size and arrangement of the plurality of discrete pillars 24 may be optimized based on modelling and/or empirical evidence. In the embodiment depicted in FIGS. 3A and 3B, the number of the plurality of discrete pillars 24 is 100, however the same principals apply to embodiments in which a different number of the plurality of discrete pillars 24 is used. Also, in the embodiment depicted in FIGS. 3A and 3B, the plurality of discrete pillars 24 are columnar in shape, however the same principals apply to embodiments in which a different shape is used. For example, the plurality of discrete pillars 24 may be cylindrical (FIG. 4A) in shape. While each of the plurality of discrete pillars 24 may have the same shape, the plurality of discrete pillars 24 may also have varying shapes. For example, at least some of the plurality of discrete pillars 24 may have a different shape than at least some others of the plurality of discrete pillars 24. In an embodiment, each of the plurality of discrete pillars 24 may have a different shape.

Figure 4A:
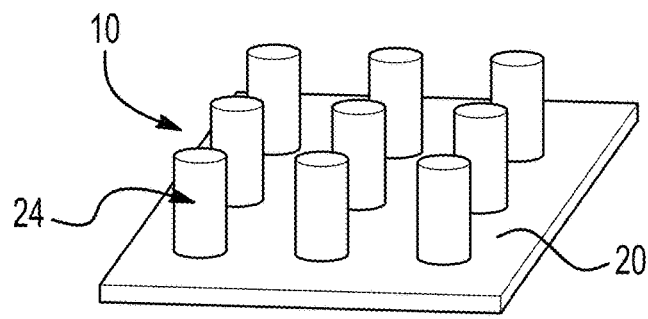
FIGS. 4A-F are schematic diagrams of various embodiments of a plurality of discrete pillars in the composite structure of FIGS. 3A and 3B.
Figures 4B, 4C:
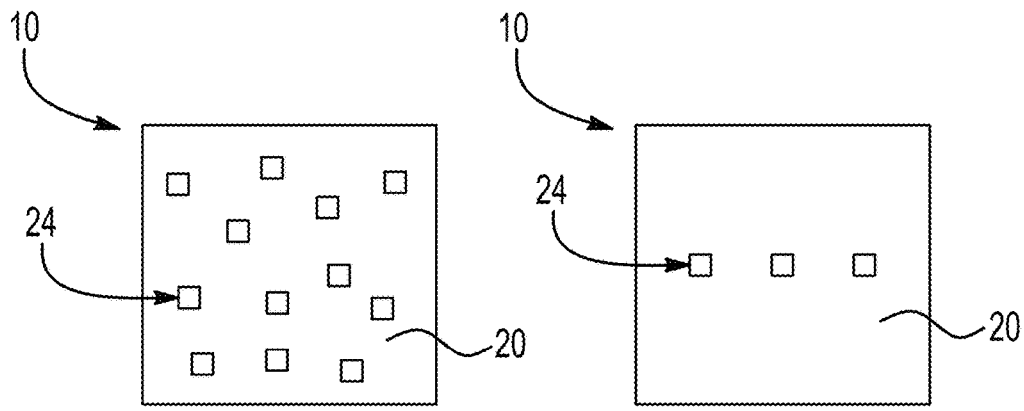
Figures 4D, 4E, 4F:
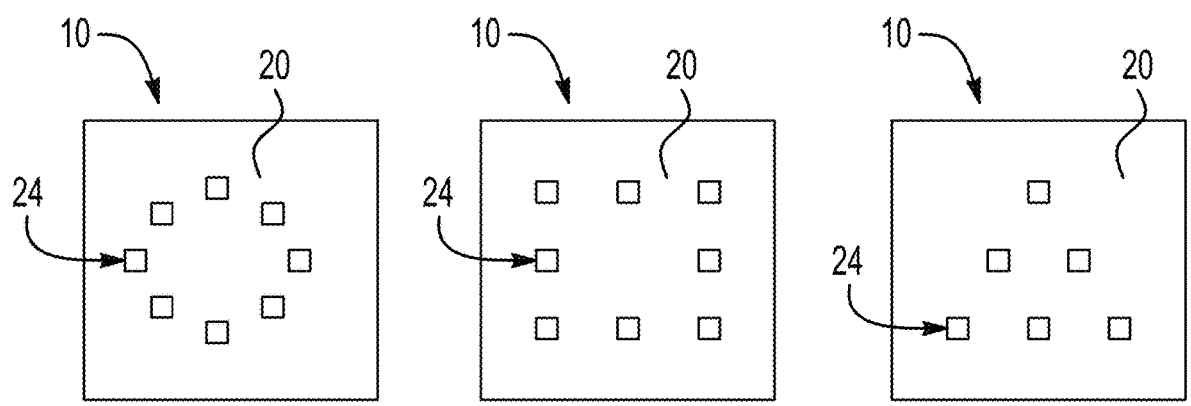

The plurality of discrete pillars 24 in the embodiments depicted in FIGS. 3A, 3B and 4A are evenly distributed in relation to each other, however the same principals apply to embodiments in which the plurality of discrete pillars 24 are unevenly distributed in relation to each other (FIG. 4B). Similarly, the same principals apply to embodiments in which the plurality of discrete pillars 24 are arranged in a particular shape or arrangement on the first surface 20. For example, the arrangement of the plurality of discrete pillars 24 may be linear (e.g., FIG. 4C), circular (e.g., FIG. 4D), polygonal (e.g., FIGS. 4E and 4F), or any other suitable shape or arrangement.

Each of the plurality of discrete pillars 24 may have a width between 0.5 mm to 2.0 mm, or more specifically between 0.75 mm to 1.5 mm. In an embodiment, each of the plurality of discrete pillars 24 has a width of 1.0 mm. Each of the plurality of discrete pillars 24 may have a length between 0.5 mm to 2.0 mm, or more specifically between 0.75 mm to 1.5 mm. In an embodiment, each of the plurality of discrete pillars 24 has a width of 1.0 mm. Each of the plurality of discrete pillars 24 may have a height between 0.5 mm to 3.0 mm, between, 0.75 mm to 2.5 mm, or more specifically between 1.0 mm to 2.0 mm. In an embodiment, each of the plurality of discrete pillars 24 has a height of 1.5 mm. The plurality of discrete pillars 24 may have varying sizes and dimensions. For example, at least some of the discrete pillars 24 may have a different size or different dimensions than at least some others of the plurality of discrete pillars 24. In an embodiment, each of the plurality of discrete pillars 24 may have a different size and/or different dimensions. Alternatively, each of the plurality of discrete pillars 24 may have the same size and/or dimensions. It will be understood that the above-described sizes and dimensions of each of the plurality of discrete pillars 24 include non-limiting examples and that any other suitable size may be applicable to the present disclosure.

A material of the plurality of discrete pillars 24 may include a controlled expansion alloy. For example, the plurality of discrete pillars 24 may include one or more of an iron alloy, a nickel alloy, and a copper alloy. The plurality of discrete pillars 24 may include varying metal alloys. For example, at least some of the plurality of discrete pillars 24 may include different metal alloy than at least some others of the plurality of discrete pillars 24. In an embodiment, each of the plurality of discrete pillars 24 may include two or more metal alloys in finely tuned proportions and each of the plurality of discrete pillars 24 may therefore include a different proportion of metal alloys. In an embodiment, however, each of the plurality of discrete pillars 24 may include the same metal alloy. The materials and proportion of materials in each of the plurality of discrete pillars 24 may be optimized based on modelling and/or empirical evidence.

A material of at least one of the first surface 20 and the second surface 22 may include alumina ceramic. For example, in an embodiment, at least one of the first surface 20 and the second surface 22 may include aluminum nitride. In another embodiment, at least one of the first surface 20 and the second surface 22 may include a metal. The first surface 20 and the second surface 22 may include the same material or may include different materials. The materials of the first surface 20 and the second surface 22 may be optimized based on modelling and/or empirical evidence.

Figure 5A:
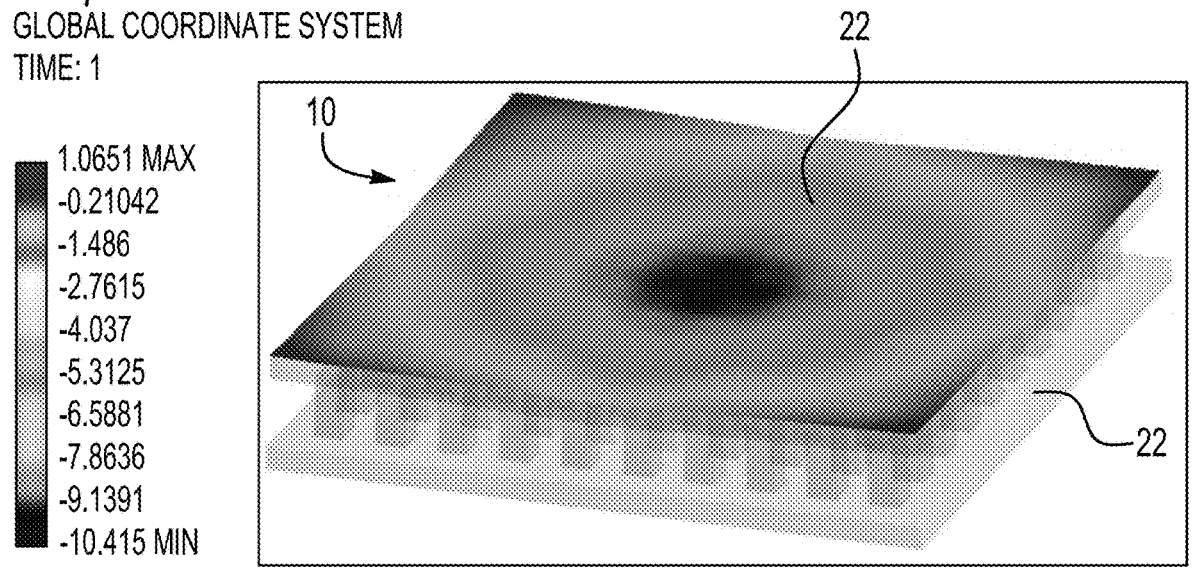
FIG. 5A is a schematic diagram and surface map of a composite structure according to an embodiment of the present invention.
Figure 5B:
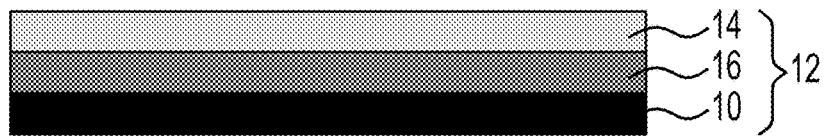
FIG. 5B is an image plane surface map according to an embodiment of the present invention.
Figure 5B:
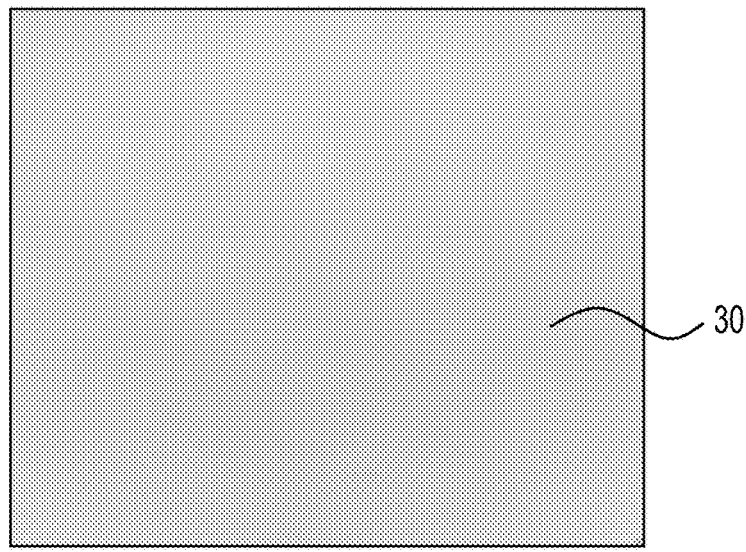

It will be understood that the above-described and depicted embodiments of the microelectronic hybrid device 10 are non-limiting examples and that any number of other suitable amount, shapes, sizes, and arrangements of the plurality of discrete pillars 24 may be applicable to the present disclosure. In any embodiment or combination, the plurality of discrete pillars 24 of the composite structure 10 are each specifically tuned to compensate for an image plane bow that may have otherwise resulted under operating temperatures. For example, with reference to FIG. 5A, under operating temperatures (e.g., as the microelectronic hybrid device 12 cools) the composite structure 24 may be configured to compress in the center, where an image plane bow in the expanding direction may have otherwise occurred. This compensation effectively reduces the thermo-mechanical stresses that would have otherwise been imparted on the components of the microelectronic hybrid device 12. Accordingly, with reference to FIG. 5B, when the composite structure 10 is disposed beneath the microelectronic hybrid device 12 and compensates for the bow, the resulting image plane 30 ends up substantially planar.

Figure 6:
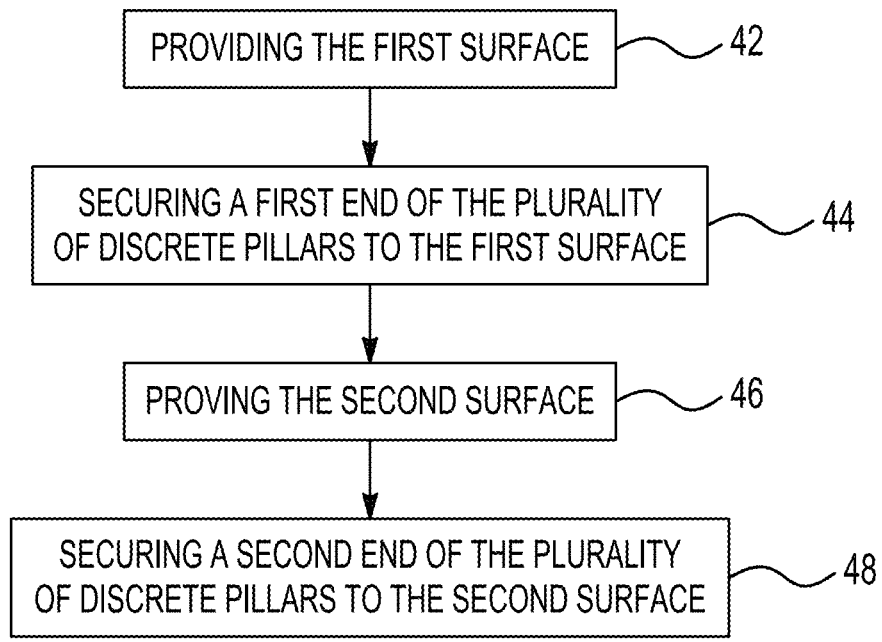
FIG. 6 is a flowchart of a method of manufacturing a composite structure according to an embodiment of the present invention.

With reference to FIG. 6, a method 40 of manufacturing the composite structure described above is depicted in a flowchart. The method 40 includes a step 42 of providing the first surface. The method 40 then includes a step 44 of securing the first end of each of the plurality of discrete pillars to the first surface. A step 46 of providing the second surface is then provided. Finally, the method 40 includes a step 48 of securing the second end of each of the plurality of discrete pillars to the second surface.

At least one of the step 44 of securing the first end of the plurality of discrete pillars to the first surface and the step 48 of securing the second end of the plurality of discrete pillars to the second surface may include at least one of soldering, welding, brazing, and adhering with an adhesive.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A composite structure for image plane normalization of a microelectronic hybrid device, the composite structure comprising: a first surface; a second surface parallel to and spaced apart from the first surface; and a plurality of discrete pillars extending between the first and second surfaces, wherein at least some of the plurality of discrete pillars have a different coefficient of thermal expansion than at least some others of the plurality of discrete pillars.

2. The composite structure according to claim 1, wherein the discrete pillars are evenly distributed between the first and second surface relative to each other.

3. The composite structure according to claim 1, wherein the discrete pillars are distributed between the first and second surface in one of: a linear arrangement, a circular arrangement, a triangular arrangement, or a polygonal arrangement.

4. The composite structure according to claim 1, wherein each of the plurality of discrete pillars is at least one of columnar and rectangular.

5. The composite structure according to claim 1, wherein at least some of the plurality of discrete pillars have a different shape than at least some others of the plurality of discrete pillars.

6. The composite structure according to claim 1, wherein each of the plurality of discrete pillars has a width between 0.5 mm and 2.0 mm.

7. The composite structure according to claim 1, a wherein each of the plurality of discrete pillars has a length between 0.5 mm and 2.0 mm.

8. The composite structure according to claim 1, wherein each of the plurality of discrete pillars has a height between 0.5 mm and 3.0 mm.

9. The composite structure according to claim 1, wherein the plurality of discrete pillars have the same dimensions.

10. The composite structure according to claim 1, wherein at least some of the plurality of discrete pillars have different dimensions than at least some others of the plurality of discrete pillars.

11. The composite structure according to claim 1, wherein the discrete pillars include at least one of a controlled expansion alloy, an iron alloy, a nickel alloy, and a copper alloy.

12. The composite structure according to claim 1, wherein at least some of the plurality of discrete pillars include a different metal alloy than at least some others of the plurality of discrete pillars.

13. The composite structure according to claim 1, wherein at least one of the first and second surfaces includes at least one of alumina ceramic, aluminum nitride, and metal.

14. The composite structure according to claim 1, wherein the first and second surfaces include the same material.

15. The composite structure according to claim 1, wherein the first and second surfaces include different materials.

16. A microelectronic hybrid device comprising: an electronic device; an integrated circuit device electrically interconnected with the electronic device;
and the composite structure according to claim 1, the composite structure disposed beneath the integrated circuit device for image plane normalization of the microelectronic hybrid device.

17. The microelectronic hybrid device according to claim 16, wherein the electronic device is a detector.

18. The microelectronic hybrid device according to claim 16, wherein the integrated circuit device is part of a readout integrated circuit (ROIC).

19. A method of manufacturing the composite structure according to claim 1, the method comprising: providing the first surface; binding first ends of the plurality of discrete pillars to the first surface;
providing the second surface; and binding second ends of the plurality of discrete pillars opposite the first ends to the second surface.

20. The method according to claim 19, wherein the binding includes at least one of soldering, welding, brazing, and adhering with an adhesive.

\* \* \* \* \*